United States Patent [19]

Lindmayer

[11] Patent Number: 4,830,875

[45] Date of Patent: May 16, 1989

[54] PHOTOLUMINESCENT MATERIALS AND ASSOCIATED PROCESS AND INFRARED SENSING DEVICE

[75] Inventor: Joseph Lindmayer, Rockville, Md.

[73] Assignee: Quantex Corporation, Rockville, Md.

[21] Appl. No.: 870,809

[22] Filed: Jun. 5, 1986

Related U.S. Application Data

[63] Continuation-in-part of Ser. No. 786,095, Oct. 10, 1985, Pat. No. 4,705,952.

[51] Int. Cl.[4] .................... B05D 5/06; C09K 11/08; G03G 5/16
[52] U.S. Cl. .................................. 427/69; 427/64; 252/301.45; 252/301.4 H; 250/327.2
[58] Field of Search ............ 427/64, 71, 66, 69; 252/301.4 S, 301.6 S, 301.4 H; 250/484.1 B, 486.1, 372.2 A–372.2 E; 430/139

[56] References Cited

U.S. PATENT DOCUMENTS

| | | | |
|---|---|---|---|
| Re. 31,847 | 3/1985 | Luckey | 250/327.2 A |
| 2,485,903 | 10/1949 | Miller | 252/301.4 S |
| 2,521,124 | 9/1950 | Miller | 252/301.4 S |
| 2,522,074 | 9/1950 | Urbach | 252/301.4 |
| 2,527,365 | 10/1950 | Leverenz | 252/301.4 S |
| 2,979,467 | 4/1961 | Keller | 252/301.4 S |
| 3,767,588 | 10/1973 | Otomo et al. | 252/301.4 H |
| 4,039,699 | 8/1977 | Morimoto et al. | 427/64 |
| 4,064,066 | 12/1977 | Toshinal et al. | 252/301.4 H |
| 4,365,184 | 12/1982 | Higton et al. | 427/66 |
| 4,377,769 | 3/1983 | Beatty et al. | 252/301.6 S |
| 4,447,305 | 5/1984 | Heindl et al. | 427/64 |
| 4,507,562 | 5/1985 | Gasiot et al. | 250/473.1 |
| 4,510,174 | 4/1985 | Holzapfel et al. | 427/71 |
| 4,517,463 | 5/1985 | Gasiot et al. | 250/327.2 |
| 4,628,208 | 12/1986 | Arakawa | 250/327.2 A |
| 4,695,725 | 9/1987 | Mori et al. | 250/327.2 C |
| 4,725,344 | 2/1988 | Yocom et al. | 427/64 |
| 4,741,993 | 5/1988 | Kano et al. | 250/484.1 B |

FOREIGN PATENT DOCUMENTS

8500089  4/1985  PCT Int'l Appl.

OTHER PUBLICATIONS

Keller et al., "Studies on Some IR Stimulate Phosphors", Phys Rev., vol. 108, #3, Nov. 1, 1957, pp. 663–676.
J. Lindmayer, "IR Phosphors as Sensors", Sensor, 3/86.
Mims, "How to See Near-IR Radiation", Modern Electronics, 5/85, pp. 64–70.

Primary Examiner—Michael Lusignan
Assistant Examiner—Marianne L. Pudgett
Attorney, Agent, or Firm—Ostrolenk, Faber, Gerb & Soffen

[57] ABSTRACT

Photoluminescent materials useful for detection of infrared light are constructed using a base material of strontium sulfide. Barium sulfate is used to increase brightness of output light of the materials, whereas lithium floride is used to allow the material to be fused together. Samarium and either cerium oxide or europium oxide are used in specific examples for providing electron traps in the photoluminescent material. An infrared sensing device or card may be constructed using the material. The photoluminescent material is made according to a process involving heating of the material to a fusing point, grinding the material after cooling, and reheating the material to below the fusing temperature. The material is then placed in a transparent binder and applied to a substrate. An alternate process involves applying the components of the photoluminescent material to a substrate of aluminum oxide and fusing the components onto the substrate.

12 Claims, 2 Drawing Sheets

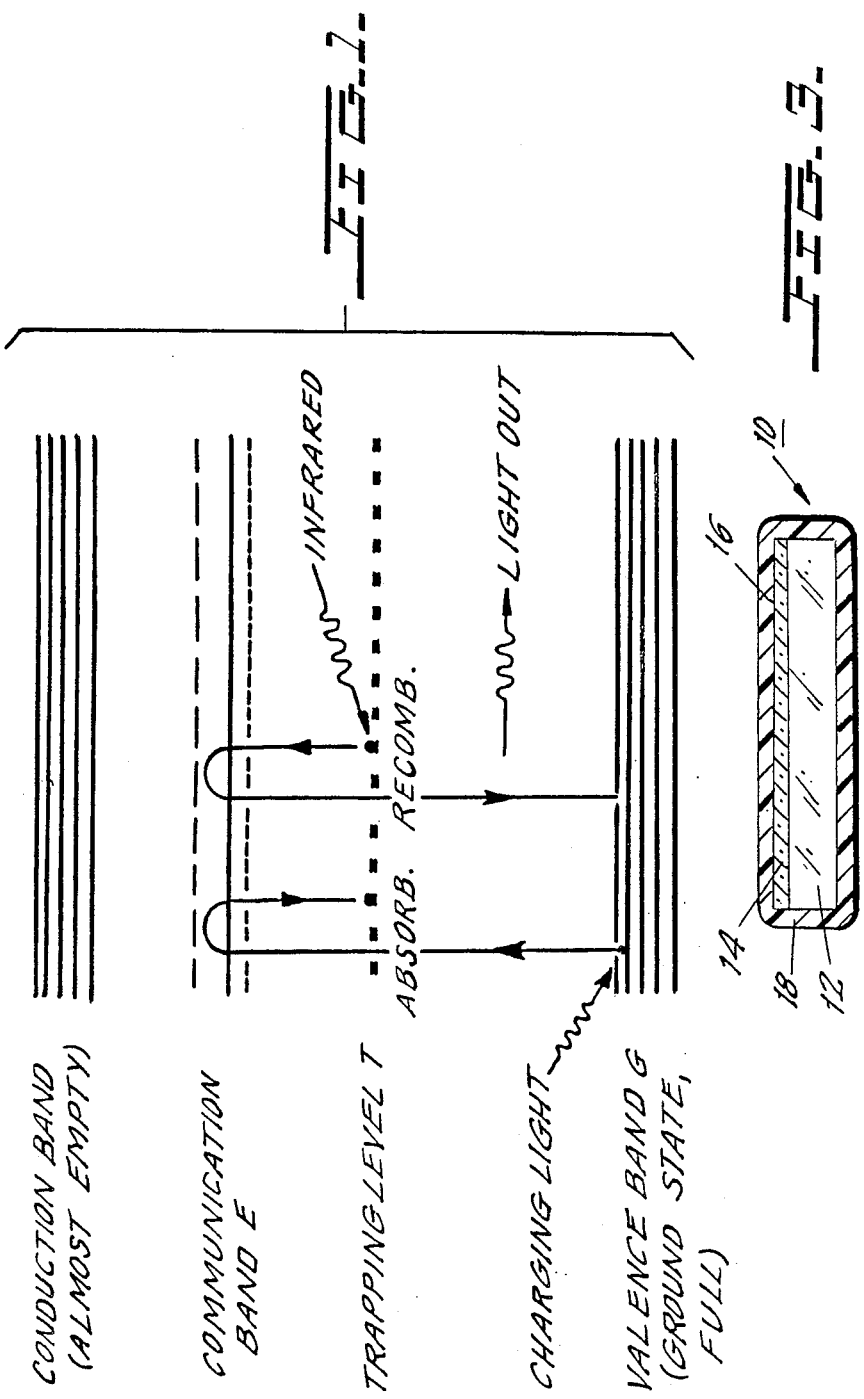

PHOTOLUMINESCENT MATERIALS AND ASSOCIATED PROCESS AND INFRARED SENSING DEVICE

CROSS-REFERENCE TO RELATED APPLICATIONS

This application is a continuation-in-prt of U.S. patent application Ser. No. 786,095 filed Oct. 10, 1985.

This application discloses materials which are useful for optical memories as described in the present inventor's U.S. patent application Ser. No. 870,877 entitled "OPTICAL MEMORY METHOD AND SYSTEM", filed concurrently herewith and assigned to a common assignee.

BACKGROUND OF THE INVENTION

This invention relates to electron trapping optical material and a process for making and using such material. Additionally, this invention relates to an infrared sensing card made from the optical material.

Materials that contain luminescent centers often include one or more types of centers that trap electrons. Upon application of suitable wavelengths of light, or application of x-rays, such solids produce free electrons. Upon removal of the energizing light, x-rays, or other radiation, the free electrons may be trapped in an energy level higher than their ground state. If the depth of the trap (that is, the amount of energy required to release the electron from the trap) is large relative to the thermal energy of the ambient temperature, the electron will remain trapped for a long time. Indeed, if the trap is sufficiently deep, the electron will remain trapped almost indefinitely unless the electron is energized by energy from light, other electromagnetic energy, or thermal energy much higher than room temperature.

As used herein, a "photoluminescent material" is a material wherein electrons trapped at high energy levels due to application of optical energy will remain trapped until light or other radiation is applied to provide sufficient energy to the electron to escape from the trap. For such photoluminescent materials, room temperature thermal energy is insufficient to allow any significant portion of trapped electrons to escape from their traps. As used herein, "optical energy" shall include visible light, infrared light, and ultraviolet light unless otherwise noted.

Although various photoluminescent materials have heretofore been known, the properties of such materials have often been less than desirable. For example, photoluminescent materials have been used for locating infrared beams by outputing visible light upon placement of the material within an infrared beam, but such previous photoluminescent materials are not sensitive enough to detect relatively low levels of infrared. The visible light output by such materials is often at a quite low level such that detection of the visible light is difficult. Further, such materials commonly have insufficient depth for the electron traps and/or a relatively low density of electron traps such that it is difficult to maintain the electrons trapped for extended periods of time. The ratio of the energy of light input to energy of light output in such materials in order to trap electrons by the freeing of the trapped electrons is often quite high. That is, a relatively large amount of energy must be put into the material to provide a given output optical energy. The development of photoluminescent materials avoiding or minimizing the disadvantages discussed above would open up numerous other applications for such materials.

OBJECTS AND SUMMARY OF THE INVENTION

Accordingly, a primary object of the present invention is to provide new photoluminescent materials avoiding or minimizing the disadvantages discussed above.

A more specific object of the present invention is to provide photoluminescent materials having sufficient electron trap depth and sufficient density of electron traps to be useful as an optical memory material.

A further object of the present invention is to provide an infrared sensing device made with photoluminescent materials.

Yet another object of the present invention is to realize a new and improved process for making photoluminescent materials.

The above and other objects of the present invention which will become more apparent as the description proceeds are realized by an electron trapping photoluminescent material comprising: a base material selected from the group of alkaline earth metal sulfides and alkaline earch metal selenides; a first dopant of from 50 to 300 parts per million of samarium; and a second dopant selected from the group of europium oxide, europium fluoride, europium fluoride, europium sulfide, and cerium oxide. The photoluminescent material further comprises from 2 to 10 parts of barium sulfate for every 100 parts of base material. The photoluminescent material consists essentially of the base material, the first dopant, the second dopant, the barium sulfate, and a fusable salt, there being at most 10 parts fusable salt for every 100 parts of base material. The base material consists of strontium sulfide. The fusable salt consists of lithium fluoride. The second dopant consists of europium oxide, there being between 400 and 600 parts per million of europium oxide. Alternately, the second dopant consists of cerium oxide, there being from 300 to 1500 parts per million of cerium oxide andd, more preferably, there is between 1150 and 1250 parts per million of samarium.

The invention further comprises an infrared sensing device having the photoluminescent material described above disposed upon a substrate. If desired, the photoluminescent material may be applied upon the substrate by use of a transparent binder. As mixing the transparent binder into the photoluminescent material will not significantly affect the optical properties of the photoluminescent material, reference in this application to "consists essentially of the base material, first dopant, second dopant, barium sulfate, and fusable salt" shall be interpreted as including those materials alone or in combination with a transparent binder.

The photoluminescent material with cerium oxide has from 50 to 200 parts per million of samarium. The material made with the cerium oxide may include between 300 and 1500 parts per million of cerium oxide, preferably from 1150 to 1250 parts per million of cerium oxide.

The process of the present invention comprises the steps of mixing a base material selected from the group of alkaline earth metal sufides and alkaline earth metal selenides, fusable salt there being at most 10 parts fusable salt for every 100 parts of base material, a first dopant of 50 to 300 parts per million of samarium, and a second dopant selected from europium oxide, europium fluoride, europium chloride, europium sulfide, and cerium oxide; after the mixing, heating the resultant mixture at a heating temperature sufficient to fuse the mixture into crystalline form; after the heating, grinding the resultant form into a powder; and after the grinding, reheating the resultant powder at a reheating temperature below the heating temperature and sufficient to repair crystal edges of the powder to yield an electron trapping optical mterial without fusing the powder into a mass. The heating step takes place in a furnace with an inert atmosphere and a temperature above 950° C. The grinding step yields a powder having particle sizes of 100 microns or less. The process further includes the step of mixing the optical material with a transparent binder and applying it to a substrate to yield an infrared sensing card.

DESCRIPTION OF THE DRAWINGS

The above and other features of the present invention will be more readily understood when the following detailed description is considered in conjunction with the accompanying drawings wherein like characters represent like parts throughout the several views and in which:

FIG. 1 is a schematic illustrating the principle of operation of the present invention.

FIG. 3 shows an infrared sensing card according to the present invention.

DETAILED DESCRIPTION

Figure 4:
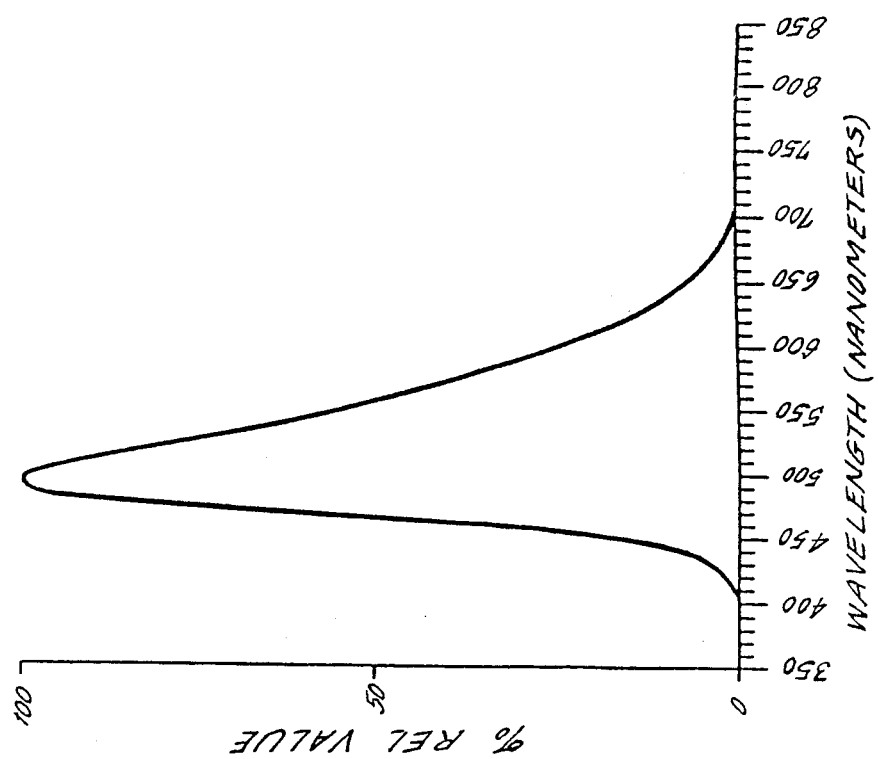
FIG. 4 shows a spectrum of output light from a second material according to the present invention.

FIG. 1 shows the principles of operation of the present invention. The electron on the left is originally in a valence band G and is energized by application of a visible charging light to a communication band E. Upon removal of the energizing light, the electron will drop back to a trapping level T. The electron will remain trapped in the trapping level until sufficient additional energy is provided to the electron to move it back up to the communication band E. As shown on the right side of FIG. 1, the electron may be stimulated by infrared electromagnetic energy to move it back to the communication band E for recombination whereupon it may move back to the valence band G and output visible light in the process. The materials of the present invention work upon the principle illustrated by FIG. 1 whereby light may be "stored" by the phenomenon of electron trapping and the light may be freed by application of infrared radiation to push the electron up above the trap and allow it to return to the valence band.

EXAMPLE 1

A photoluminescent material according to the present invention is made from a mixture having the following composition:

Strontium sulfide: 100 parts
Barium sulfate: 5.5 parts
Lithium fluoride: 5.5 parts
Samarium: 150 parts per million
Europium oxide: 550 parts per million As used above and throughout this application, "parts" and "parts per million" shall refer to parts by weight unless otherwise noted.

The mixture is placed into a graphite crucible within a furnace flushed with a dry nitrogen atmosphere (derived from liquid source) or other dry inert atmosphere such as argon, and heated to between 1150° and 1300° Centigrade (preferably 1200°) for 30 minutes to 1 hour such that it forms a fused mass. For longer heating times, a fused mass could be formed at temperatures as low as 950° C. Temperatures as high as 2000° C. could be used to form a fused mass in shorter times.

After cooling, the fused mass is ground into a fine powder having a particle size of 1 to 10 microns if the material is to be used for optical memory material. If the material is to be used for an infrared sensing card or for an optical viewing screen, the fused mass is ground to between 10 and 100 microns. The particle size could be larger for large screens, which screens would generate visible images from infrared input.

After grinding, the powdered material is heated to about 300° to 700° Centigrade (preferably 600°) in the graphite crucible within the nitrogen or other inert atmosphere furnace. This second heating is below the fusing temperature of the material (about 700°) and is maintained for 10 to 60 minutes (preferably 30 minutes). This second heating provides repair to the crystalline surfaces of the powdered material which resulted from the earlier steps.

After the second heating, the material is cooled and the powdered material is then mixed with a suitable binder or vehicle such as acrylic, polyethylene, or other organic polymer.

After the material has been mixed with a transparent binder, it is applied as a thin coating to a clear plastic, aluminum oxide, glass, paper, or other substrate in order to realize an infrared sensing device or card according to the present invention. The coating of the photoluminescent material upon the substrate will preferably be between 1 micron and 500 microns in thickness.

In the above mixture, the strontium sulfide serves as a base material whereas the lithium fluoride is used to provide the fusability characteristic useful for the specific preferred embodiment. Alternately, other alkaline earth metal sulfides and alkaline earth metal selenides might be used as the base material.

The barium sulfate in the above mixture is used to improve the brightness of output light from the memory material. Preferably 5.5 parts are used as noted above, but between 2 and 10 parts may be used of the barium sulfate as well as between 2 and 10 parts of lithium fluoride relative to the 100 parts of strontium sulfide. The barium sulfate is not absolutely essential, but between 1% and 5% barium sulfate by weight will greatly improve the optical characteristics of the material.

The samarium and europium oxide in the above mixture are used for establishing the electron trap. Preferably 150 parts per million of samarium are used, but the samarium could alternately be between 50 parts per million and 300 parts per million. The europium oxide would preferably be between 300 and 800 parts per million and between 400 and 600 parts per million are most preferred with 550 parts per million being the optimal value. Europium fluoride, europium chloride, or europium sulfide could be used in lieu of europium oxide.

Figure 2:
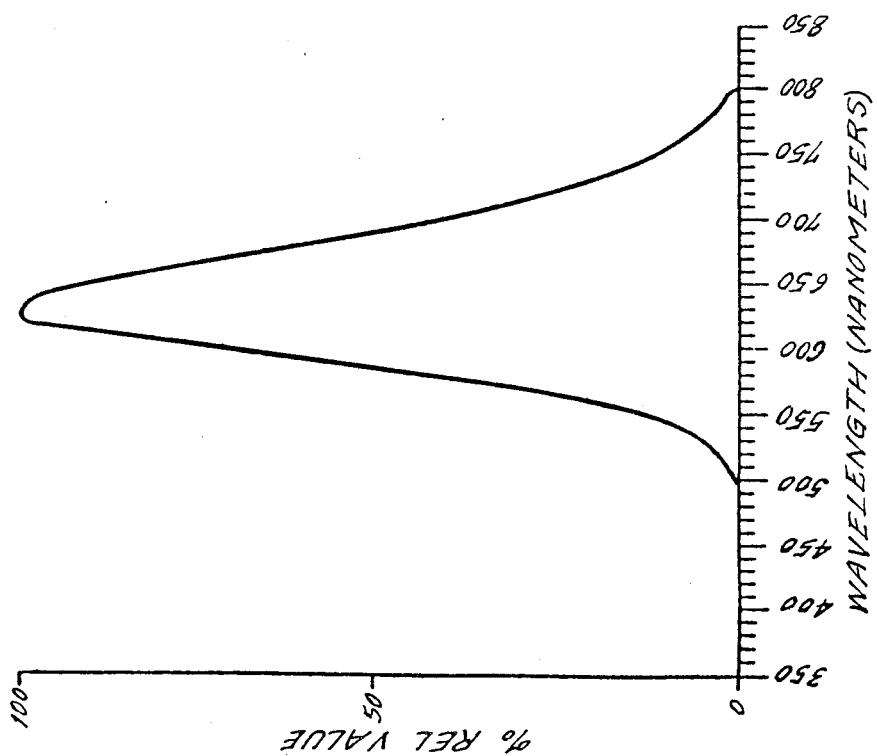
FIG. 2 shows the spectrum of light output by a first material according to the present invention.

The mixture resulting from the above process provides a depth for electron traps of 1.2 electron volts and has an output spectrum as shown by FIG. 2 which illustrates that the center frequency of the output is approximately 620 nanometers corresponding to an orange light.

FIG. 3 shows an infrared sensing device 10 according to the present invention. As illustrated, the device 10 is of a card (shown in side view) having a substrate 12 and the photoluminescent material applied with a transparent binder at 14 to the substrate 12. The substrate 12 is paper, aluminum oxide, plastic such as PVC or other material. The material 14 extends along a planar surface 16 perpendicular to the plane of view of FIG. 3. An optional transparent plastic coating 18 may encapsulate the material 14 and substrate 12.

The card or device 10 of FIG. 3 is useful for aligning scientific or industrial instrumentation having infrared beams. In particular, the card 10 may by "charged up" by placement of the photoluminescent material 14 in a strong visible light such that electrons will be trapped. The card 10 may then be placed in front of an infrared light source. The photoluminescent material 14 will output a visible light at the place where the infrared beam strikes the material, thereby allowing the user to identify exactly where the otherwise invisible beam of infrared radiation is located. Accordingly, the card 10 may be used to calibrate scientific or industrial instruments. Advantageously, the material of Example 1 above and other materials discussed in this application provide a relatively high output light upon stimulation by infrared such that the card can be used with some background visible light. That is, the light output is sufficient that the visible light output by the freeing of trapped electrons in the photoluminescent material 14 will be visible despite the background light. A screen for displaying infrared information as visible light patterns can be made by the same process.

EXAMPLE 2

A second photoluminescent material according to the present invention may be made with the following composition:

Strontium sulfide: 100 parts
Barium sulfate: 5 parts
Lithium fluoride: 10 parts
Samarium: 100 parts per million
Cerium oxide: 1200 parts per million The above mixture is processed in the same process in Example 1 by first heating it to fusing, grinding the resultant fused mass, and then reheating at below the fusing temperature but sufficiently high to allow repair of damage to the crystalline parts. Cooling may be used after each of the heating and reheating steps. The same process steps in terms of temperature and time intervals may be used in processing this second material. The resulting powder may be ground as with Example 1, combined with a transparent binder or vehicle, and applied to a substrate to realize a card or device for infrared sensing as illustrated by 10 in FIG. 3.

In the above mixture, the barium sulfide may vary between 2 and 10 parts, the lithium fluoride may vary between 2 and 10 parts, the samarium may vary between 50 and 200 parts per million, and the cerium oxide may vary between 300 and 1500 parts per million. The specific values for portions which are given above provide highly superior characteristics such as sensitivity. The second material may be charged up very quickly with visible light. The material may hold the charge for extended periods of time similar to the first material and will trigger re-emission of visible light of about 500 nanometers (blue-green light) upon application of an infrared source. The emission spectrum under IR stimulation is illustrated in FIG. 4.

EXAMPLE 3

A photoluminescent material is made according to the ingredients and the process of Example 2 above except that the mixture is heated for 2 hours in the fusing step. The output spectrum of this photoluminescent material will be essentially the same as FIG. 4, but this material is different from Example 2 in that the extended fusing step extends the infrared sensitivity of higher wavelengths.

EXAMPLE 4

A photoluminescent material is made having the following composition:

Strontium sulfide: 100 parts
Barium sulfate: 5.5 parts
Samarium: 150 parts per million
Europium oxide: 550 parts per million The listed materials (within ranges specified for Example 1 above) are deposited upon a substrate of aluminum oxide by any known technique including physical deposition (evaporation, sputtering, etc.) or chemical vapor deposition, gaseous diffusion, ion beam deposition, molecular beam deposition, and electron beam deposition. The materials and substrate are placed into a furnace for fusing under the conditions of Example 1. The material fuses without the use of the lithium fluoride of Example 1. Because the photoluminescent material bonds so well to the aluminum oxide substrate, the use of separate binders or vehicles is unnecessary.

The structure resulting from the fusing step may optionally be encapsulated in clear plastic to realize the device 10 of FIG. 3. No grinding or reheating is necessary. The process of Example 4 may be applied to an aluminum oxide disc to provide an optical memory which could likewise be coated by clear plastic.

The process of Example 4 could be used with the starting materials of Examples 2 and 3 except that lithium fluoride would not be used. The fusing step could be accomplished under the conditions of Example 2 or Example 3. As with Examples 1, 2, and 3, the use of barium sulfate is not absolutely essential but greatly improves the optical characteristics of the material.

The substrate for Example 4 could be aluminum oxide in the form of sapphire or ruby in which case the layer of optical material could be as thin as 0.5 microns.

The optical materials of the present invention may be used for IR sensing and/or as a memory by their electron trapping characteristics in crystal form (i.e., the form in Examples 1, 2, and 3 before grinding), powder form (Examples 1, 2, and 3), and amorphous form (Example 4).

Although various specific details have been discussed herein, it is to be understood that these are for illustrative purposes only. Various modifications and adaptations will be apparent to those of skill in the art. Accordingly, the scope of the present invention should be determined by reference to the claims appended hereto.

What is claimed is:

1. A process for coating a substrate with an electron trapping photoluminescent material, comprising the steps of:
   a. mixing,
      I. a base material selected from the group of alkaline earth metal sulfides and alkaline earth metal selenides, II. a first dopant of 50 to 300 parts per million by weight of samarium, and III. a second dopant selected from europium oxide, europium fluoride, europium chloride, europium sulfide, and cerium oxide;

b. vapor depositing said mixture to a thickness of at least 0.5 microns upon a substrate of aluminum oxide to obtain a thin film device; and c. fusing the deposited materials into a crystalline form of electron trapping photoluminescent material and bonding the photoluminescent material to the substrate solely by heating the deposited materials and substrate in an atmosphere flushed with a dry inert gas.

2. A process as described in claim 1, wherein the substrate is selected to be sapphire.

3. A process as described in claim 1, wherein the material is deposited by physical deposition.

4. A process as described in claim 3, wherein the physical deposition is accomplished by evaporation.

5. A process as described in claim 3, wherein the physical deposition is accomplished by sputtering.

6. A process as described in claim 1, wherein the heating step is accomplished at a temperature of at least 950° C.

7. A process as described in claim 1, wherein said mixing step includes mixing from 50 to 300 ppm by weight of samarium and between 300 and 800 ppm by weight of europium oxide.

8. A process as described in claim 1, wherein said mixing step includes mixing between 50 and 200 ppm by weight of samarium and between 300 and 1500 ppm by weight of serium oxide.

9. A process as described in claim1, wherein said material is deposited on said substrated by evaporation.

10. A process as described in claim 1, wherein said material is deposited on said substrated by sputtering.

11. A process as described in claim 9, wherein the substrate is selected to be sapphire.

12. A process is described in claim 10, wherein the substrate is selected to be sapphire.

* * * * *